(12) United States Patent
Yoo et al.

(10) Patent No.: US 11,530,489 B2
(45) Date of Patent: Dec. 20, 2022

(54) APPARATUS FOR ELECTRO-FORMING AND APPARATUS FOR HORIZONTAL ELECTRO-FORMING

(71) Applicant: LG Display Co., Ltd., Seoul (KR)

(72) Inventors: ByeongSun Yoo, Goyang-si (KR); WooChan Kim, Goyang-si (KR); Gotae Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 50 days.

(21) Appl. No.: 16/730,582

(22) Filed: Dec. 30, 2019

(65) Prior Publication Data

US 2020/0208288 A1 Jul. 2, 2020

(30) Foreign Application Priority Data

Dec. 31, 2018 (KR) .......................... 10-2018-0173597

(51) Int. Cl.
*C25D 5/04* (2006.01)
*C25D 5/02* (2006.01)
(Continued)

(52) U.S. Cl.
CPC .................. *C25D 5/04* (2013.01); *B05D 1/02* (2013.01); *C23C 18/1603* (2013.01); *C25D 1/10* (2013.01);
(Continued)

(58) Field of Classification Search
None
See application file for complete search history.

(56) References Cited

U.S. PATENT DOCUMENTS 3,862,891 A 1/1975 Smith
6,143,155 A * 11/2000 Adams ................ H01L 21/7684
205/147
(Continued)

FOREIGN PATENT DOCUMENTS

CN 102560586 A 7/2012
CN 103911639 A 7/2014
(Continued)

OTHER PUBLICATIONS

Chinese Office Action, dated Dec. 13, 2021, for Chinese Application No. 201911338253.9, 19 pages. (with English Translation).
Xu et al., "Electrochemistry and Engineering Design," China University of Mining and Technology Press, Xuzhou, People's Republic of China, 2018, p. 32, Chinese-Language Text.

*Primary Examiner* — Louis J Rufo
(74) *Attorney, Agent, or Firm* — Seed IP Law Group LLP

(57) ABSTRACT

Provided is an apparatus for electro-forming. The apparatus for electro-forming includes a plating bath which is a space where a substrate is plated and a clamp disposed within the plating bath and configured to grasp the substrate disposed in a horizontal direction. The apparatus for electro-forming further includes an assembly including an anode spaced above the substrate and connected to an external power supply and a plating solution supply unit spaced above the substrate and configured to supply a plating solution. The apparatus for electro-forming also includes a driving unit configured to reciprocate the assembly in a horizontal direction at a distance from the substrate. The assembly further includes an insulator between the anode and the plating solution supply unit.

13 Claims, 10 Drawing Sheets

(51) Int. Cl.
  *H05K 3/18* (2006.01)
  *B05D 1/02* (2006.01)
  *C23C 18/16* (2006.01)
  *C25D 17/00* (2006.01)
  *C25D 3/02* (2006.01)
  *C25D 1/10* (2006.01)
  *C25D 5/18* (2006.01)

(52) U.S. Cl.
  CPC ............... *C25D 3/02* (2013.01); *C25D 5/022* (2013.01); *C25D 5/026* (2013.01); *C25D 17/00* (2013.01); *H05K 3/188* (2013.01); *C25D 5/18* (2013.01)

(56) References Cited

U.S. PATENT DOCUMENTS

2007/0068819 A1* 3/2007 Singh .................. H01L 21/2885
    205/83
2010/0122908 A1* 5/2010 Takeguchi ............... C25D 5/18
    205/83

FOREIGN PATENT DOCUMENTS

| CN | 108342756 A | 7/2018 | |
|---|---|---|---|
| KR | 10-2014-0087649 A | 7/2014 | |
| KR | 10-2018-0000133 A | 1/2018 | |
| WO | WO-2019190115 A1 * | 10/2019 | ............. C25D 17/00 |

* cited by examiner

APPARATUS FOR ELECTRO-FORMING AND APPARATUS FOR HORIZONTAL ELECTRO-FORMING

CROSS-REFERENCE TO RELATED APPLICATIONS

This application claims the priority of Korean Patent Application No. 10-2018-0173597 filed on Dec. 31, 2018, in the Korean Intellectual Property Office, the disclosure of which is incorporated herein by reference.

BACKGROUND

Technical Field

The present disclosure relates to an apparatus for electro-forming and an apparatus for horizontal electro-forming.

Description of the Related Art

Plating is used to increase the added-value of a final product by giving the surfaces of materials and parts functional properties such as corrosion resistance, durability, and conductivity or improving the appearance through physical, chemical, and electrochemical treatments. Thus, it is the core technology of the materials and parts industry. The plating can be roughly classified into wet plating that is performed in an aqueous solution and dry plating that is performed in the atmosphere and a vacuum state. Examples of the wet plating include electroplating, electroless plating, anodization, and chemical conversion treatment, and examples of the dry plating include hot dipping, thermal spraying, physical deposition, and chemical deposition. The wet plating has advantages such as high plating speed, high economic feasibility, easiness of adding various functional properties, and convenience for continuous process and mass production. Therefore, the wet plating is a technology which has grown and will continue to grow.

BRIEF SUMMARY

The inventors of the present disclosure used such a plating process and developed a process for forming a mask, e.g., a fine metal mask (FMM), used when manufacturing an organic light emitting display device.

An organic light emitting diode (OLED) display device is configured to emit light by electrically exciting a fluorescent or phosphorescent organic compound and can display images by driving organic light emitting cells.

An organic light emitting cell includes an anode, an organic thin film, and a cathode. The organic thin film has a multilayer structure including an emitting layer (EML), an electron transport layer (ETL), and a hole transport layer (HTL). Thus, the organic thin film can achieve a balance between electrons and holes and thus improve the luminous efficiency. The organic thin film may further include an electron injecting layer (EIL) and a hole injecting layer (HIL).

In order for an organic electro-luminescence device to realize full-color, red (R), green (G), and blue (B) EMLs need to be patterned. The FMM is used to pattern these EMLs. In some cases, a white (W) EML may be further provided in addition to the R, G and B EMLs to improve the luminous efficiency.

The FMM may be formed mainly using Invar (an alloy of iron and nickel) in consideration of thermal expansion and the like. A representative method for producing an Invar alloy (36% Ni-64% Fe) or a Super Invar alloy (32% Ni-63% Fe-5% Co) used for production of FMM may be cold-rolling. To obtain a thin plate having a thickness of about 50 $\mu$m or less by cold-rolling, multi-stage rolling processes are needed. The processes are long and complicated, which results in a high manufacturing cost. Further, a rolled Invar thin plate having a thickness of about 50 $\mu$m or less produced by cold-rolling is limited in width to about 500 mm or less. Thus, it has been difficult to apply the rolled Invar thin plate to a material for large-scale process. In these circumstances, the cost of manufacturing OLED display devices required to have a thickness of about 20 $\mu$m or less has increased and the yield of manufacturing large-scale OLED display device has decreased, which causes an increase in manufacturing cost. Accordingly, it has become difficult to develop display technologies.

FMMs have recently been getting larger to improve the productivity of big screen OLED TVs and OLED display devices.

With this trend, a new method of producing an Invar alloy for FMM by electro-forming is being developed.

In this method, an anode and a cathode are disposed in parallel facing each other in an inside space of a plating bath and a substrate to be plated is disposed between the anode and the cathode. After a plating solution (an electrolyte) is supplied into the inside space of the plating bath, the anode and the cathode are connected to an anode power supply and a cathode power supply, respectively. Then, when a current is applied thereto, a plating layer (an Invar alloy) is formed on one surface of the substrate. Then, the plating layer is separated from the substrate and post-processed to finally manufacture an FMM. Conventionally, vertical electro-forming of plating a substrate disposed in a vertical direction has mainly been used. However, according to this vertical electro-forming method, as the area of plating becomes larger, the size of the plating bath is increased proportionally. An increase in the size of the plating bath in a limited installation space has been one of the causes of low productivity. While plating is performed on a large area during electro-forming, the current density in each region may become non-uniform. The non-uniformity of the current density may cause the non-uniformity of the thickness of the plating layer, which is one of the factors relating to the quality of an Invar alloy.

The inventors of the present disclosure recognized that to increase the size of FMMs, the plating method needs to be changed and a highly advanced technology for optimizing the current density in a plating process is needed. Accordingly, the inventors of the present disclosure did research on an apparatus for horizontal electro-forming to overcome the limitations of the vertical electro-forming. Also, the inventors of the present disclosure did research for maintaining a uniform current density in each region of a substrate by horizontal electro-forming together with the development of the apparatus for horizontal electro-forming. The inventors of the present disclosure invented, for example, a configuration of a plating bath, an anode, and a plating solution supply apparatus for horizontal electro-forming and a method for placing and transferring a substrate. In the apparatus for electro-forming, a configuration of a plating solution supply apparatus and an anode and a distance from a substrate are optimized when horizontal electro-forming is performed. Thus, a plating solution can be properly supplied to a substrate and the current density becomes uniform. Therefore, a plating layer can have a uniform thickness.

The present disclosure is not limited to the above-mentioned objects, and other objects, which are not mentioned above, can be clearly understood by those skilled in the art from the following descriptions.

According to an aspect of the present disclosure, an apparatus for electro-forming includes a plating bath which is a space where a substrate is plated and a clamp disposed within the plating bath and configured to grasp the substrate disposed in a horizontal direction. The apparatus for electro-forming further includes an assembly including an anode spaced above the substrate and connected to an external power supply and a plating solution supply unit spaced above the substrate and configured to supply a plating solution. The apparatus for electro-forming also includes a driving unit configured to reciprocate the assembly in a horizontal direction at a distance from the substrate. The assembly further includes an insulator between the anode and the plating solution supply unit.

According to another aspect of the present disclosure, an apparatus for horizontal electro-forming includes a plating bath, a cathode unit disposed within the plating bath and an anode unit connected to an external power supply. The apparatus for horizontal electro-forming further includes a plating solution supply nozzle configured to supply a plating solution and an assembly structure including the anode unit and the plating solution supply nozzle disposed on each of both side surfaces of the anode unit. The assembly structure further includes an insulator between the anode unit and the plating solution supply nozzle.

Other detailed matters of the exemplary embodiments are included in the detailed description and the drawings.

According to the present disclosure, the apparatus for manufacturing an FMM may be designed to horizontally load and unload a substrate to the apparatus through horizontal electro-forming. The horizontal electro-forming method uses a smaller plating bath than a vertical plating apparatus. Thus, the installation space can be optimized to improve the productivity.

According to the present disclosure, the apparatus for manufacturing an FMM includes the assembly spaced above the substrate at a predetermined distance and including the anode and the plating solution supply unit, for horizontal electro-forming. The assembly performs a process of spraying a plating solution and depositing a plating layer while moving along the substrate and thus can manufacture a large FMM.

According to the present disclosure, the apparatus for manufacturing an FMM includes the assembly including the anode and the plating solution supply unit. Therefore, the apparatus for manufacturing an FMM can perform plating to a uniform thickness regardless of the area of plating and thus can improve the plating thickness uniformity.

According to the present disclosure, in the apparatus for manufacturing an FMM, a plurality of clamps that functions as a cathode and functions to grasp the substrate is disposed on both sides of the substrate. Therefore, the current density applied to each plating region can be regulated freely by regulating a voltage applied to clamps located corresponding to each other.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
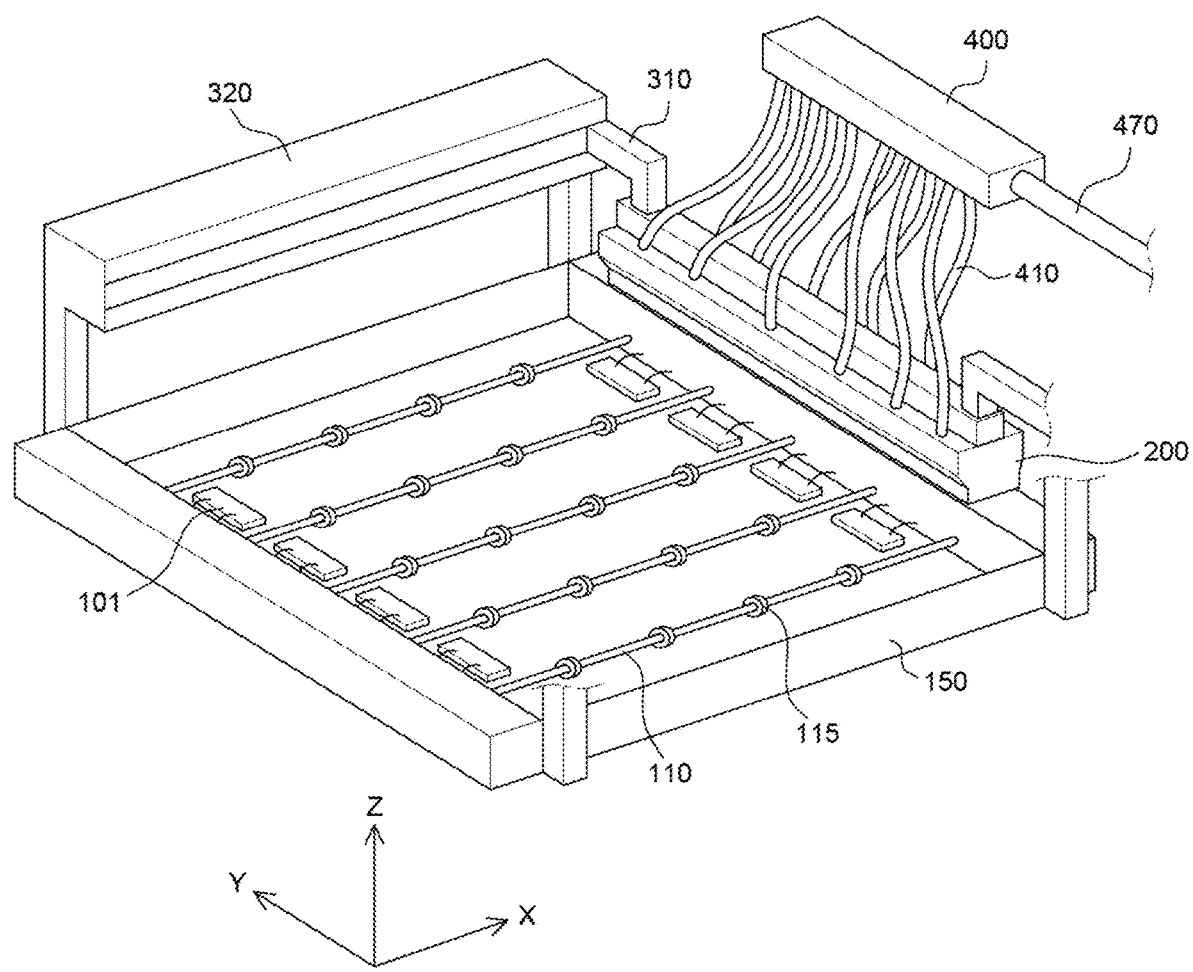
FIG. 1 is a schematic perspective view of an apparatus for electro-forming according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

When the time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Further, in describing components of the present disclosure, terms such as first, second, A, B, (a), (b), etc., can be used. These terms are used only to differentiate the components from other components. Therefore, the nature, order, sequence, or number of the corresponding components are not limited by these terms. It is to be understood that when one element is referred to as being "connected to" or "coupled to" another element, it may be directly connected to or directly coupled to another element, connected to or coupled to another element, having still another element "intervening" therebetween, or "connected to" or "coupled to" another element via still another element.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
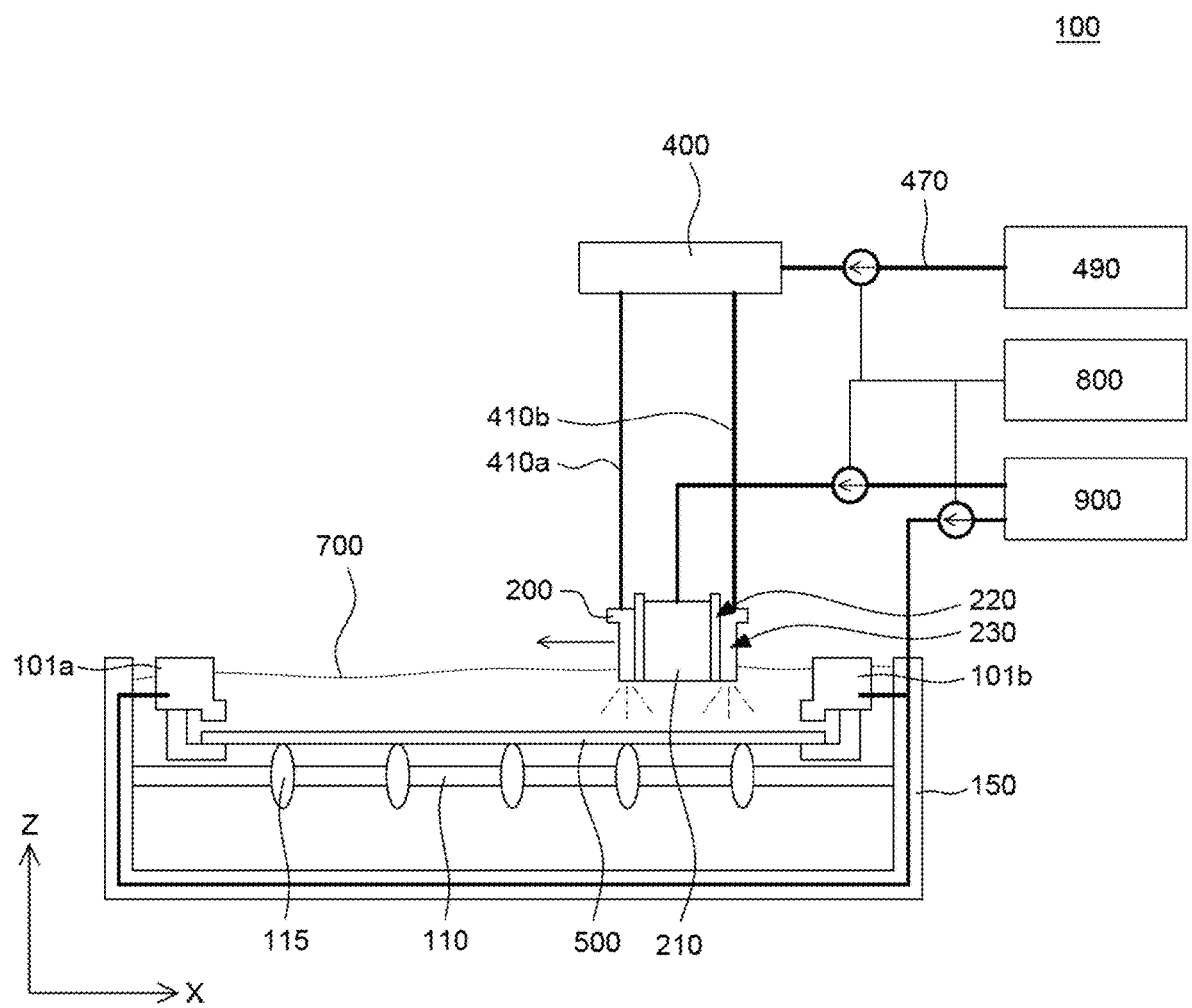
FIG. 2 is a schematic cross-sectional view as taken along an X-axis/Z-axis plane of FIG. 1.
Figure 3:
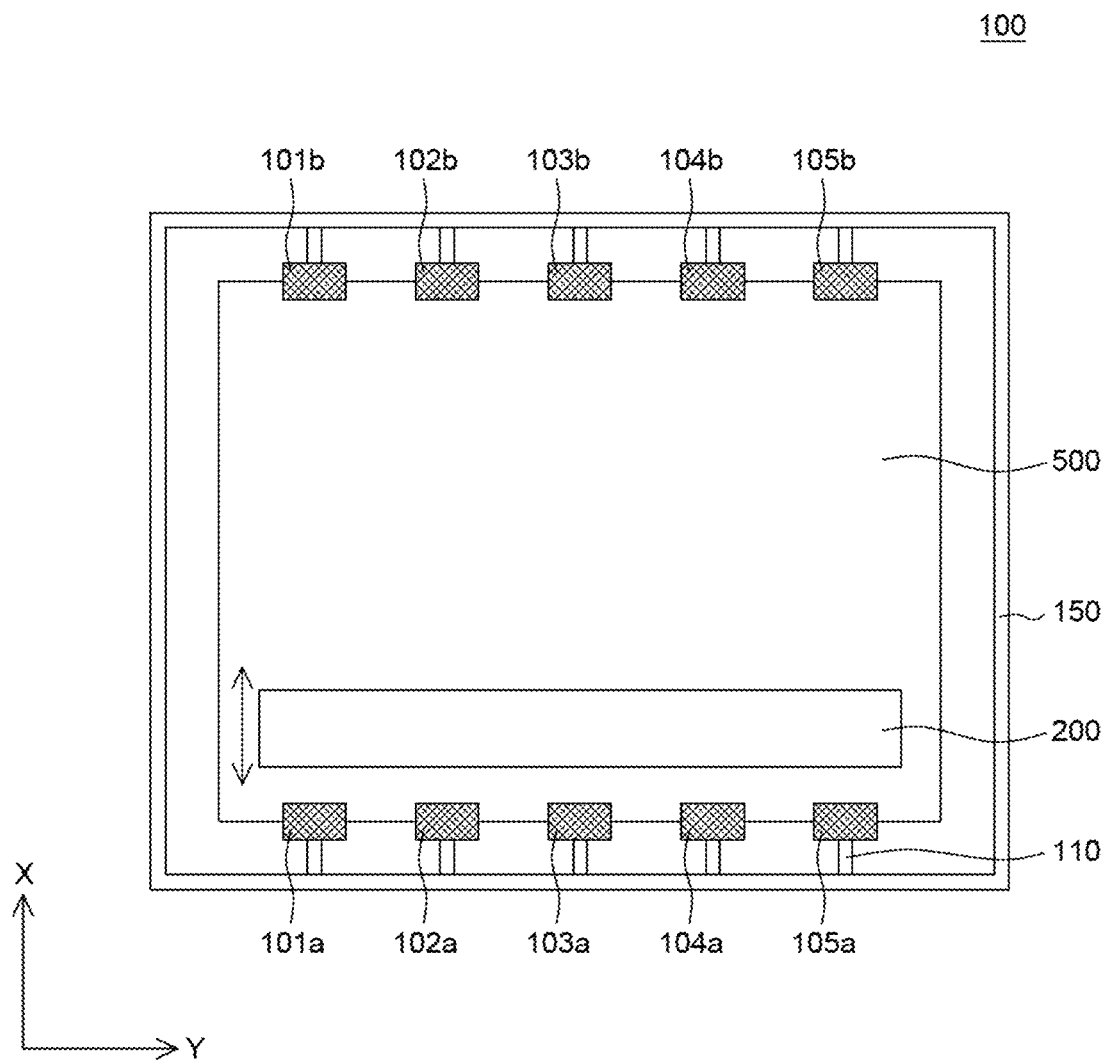
FIG. 3 is a schematic plan view as taken along an X-axis/Y-axis plane of FIG. 1.
Figure 7A:
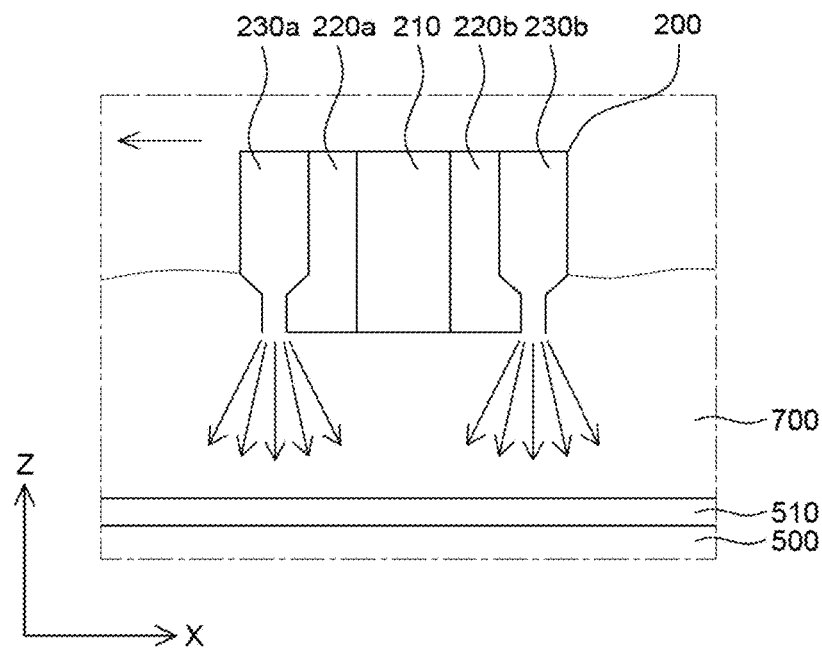
FIG. 7A and FIG. 7B show the distribution of a plating solution supplied from the assembly of the apparatus for electro-forming according to an embodiment of the present disclosure.
Figure 7B:
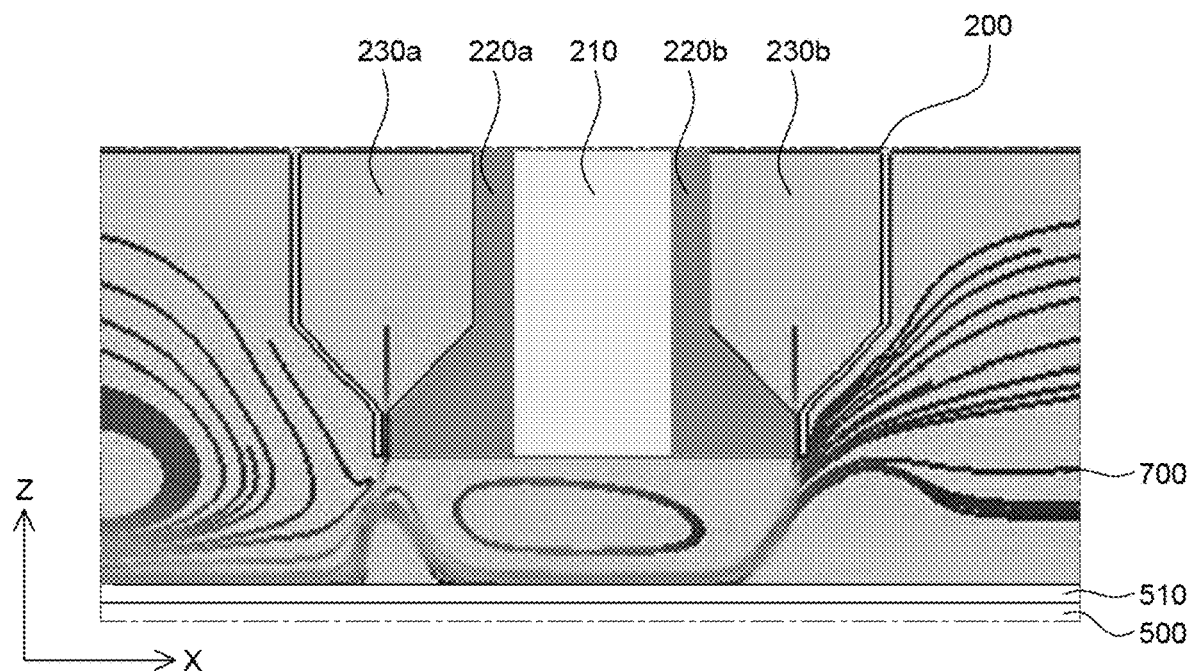

FIG. 1 is a schematic perspective view of an apparatus for electro-forming according to an embodiment of the present disclosure. FIG. 2 is a schematic cross-sectional view as taken along an X-axis/Z-axis plane of FIG. 1. FIG. 3 is a schematic plan view as taken along an X-axis/Y-axis plane of FIG. 1. Referring to FIG. 1 through FIG. 3, an apparatus 100 for electro-forming (hereinafter, referred to as "electro-forming apparatus 100") according to an embodiment of the present disclosure includes a plating bath 150 and a transfer support unit 110 (or may be referred to as a transfer support structure 110). The electro-forming apparatus 100 further includes a clamp 101 that functions as a cathode, an insulator 220 (as shown in FIGS. 7A and 7B), an assembly 200 including an anode 210 and a spray nozzle (also called as a plating solution supply nozzle or a plating solution supply unit; 230), and a connection unit 310 (or may be referred to as a connection structure 310). The electro-forming apparatus 100 also includes a driving unit 320, a plating solution transfer unit 400, a first plating solution transfer line 410, a second plating solution transfer line 470, a plating solution storage 490, a controller 800, and a power supply unit 900 (or may be referred to as a power supply 900).

The plating bath 150 provides an inside space where a plating solution 700 is filled. In the plating bath 150, the clamp 101 configured to receive a substrate 500 on which a plating layer is to be formed and fix the substrate 500 may be disposed. Further, the plating bath 150 may have a spatial size where a sufficient amount of the plating solution 700 can be supplied to form a plating layer on the substrate 500 and a remaining plating solution can be discharged. The plating bath 150 may have a hexahedral shape with a top opening, but is not limited thereto.

The transfer support unit 110 is a substrate configured to load the substrate 500, which is a plating target object, into the plating bath 150 and support the substrate 500 during a process of supplying the plating solution 700. The transfer support unit 110 is disposed in an X-axis direction within the plating bath 150 and includes rollers 115 mounted on a plurality of shafts (or rods) and films to transfer the substrate 500. When the plurality of shafts is rotated to transfer the substrate 500, the rollers 115 are rotated accordingly. As the rollers 115 are rotated, the transfer support unit 110 supports and transfers the substrate 500 disposed outside the plating bath 150 into the plating bath 150. When the substrate 500 reaches a position for plating, the shafts stop driving and the transfer support unit 110 functions as a stage for supporting the substrate 500. FIG. 1 illustrates the transfer support unit 110 in which four rollers 115 are mounted on each of five shafts. However, the present disclosure is not limited thereto. More transfer support units 110 may be disposed to improve the flatness of the substrate 500. Further, the shape of the transfer support unit 110 is not limited to the illustration of the drawings, but may be a mesh shape or a plate shape.

The substrate 500 is a plating target object, and a plating layer is formed on a surface of the substrate 500 by the electro-forming apparatus 100 according to an embodiment of the present disclosure. For example, a seed pattern functioning as a seed during a plating process is formed of a conductive material on the substrate 500. The substrate 500 including the seed pattern thereon is disposed on the transfer support unit 110. The substrate 500 is disposed in a horizontal direction within the plating bath 150. Thus, when the plating bath 150 is filled with the plating solution 700, the surface of the substrate 500 may be disposed substantially parallel to a surface of the plating solution 700. The substrate 500 may be a conductor or a nonconductor, but is not limited thereto. Herein, it has been described that the substrate 500 and the seed pattern are separate components, but the substrate 500 may be defined as including the seed pattern.

The clamp 101 is disposed on both sides of the substrate 500 to grasp the substrate 500 and apply a current to the substrate 500. For example, the clamp 101 may apply a current to the seed pattern disposed on the substrate 500. Thus, a plating layer may be formed on the surface of the substrate 500 by the flow of electricity between the clamp 101 and the anode 210.

The clamp 101 may be formed as a plurality of clamps on both sides of the plating bath 150 to grasp the substrate 500. For example, a pair of clamps 101 may be formed on the respective both sides of the substrate 500 and several pairs of clamps 101 may be disposed in the same manner to stably grasp the substrate 500.

The clamp 101 may include a first clamp 101a and a second clamp 101b disposed on the respective both sides of the substrate 500 based on the X-axis direction that is a movement direction of the anode 210. For example, the clamp 101 may include first to tenth clamps 101a to 105a disposed on the both sides of the substrate 500. The first clamp 101a, a third clamp 102a, a fifth clamp 103a, a seventh clamp 104a, and a ninth clamp 105a are disposed on one side of the substrate 500. The second clamp 101b, a fourth clamp 102b, a sixth clamp 103b, an eighth clamp 104b, and a tenth clamp 105b may be disposed on the other side of the substrate 500. The first to ninth clamps 101a to 105a may be disposed facing the second to tenth clamps 101b to 105b. Due to the plurality of clamps 101, different current densities may be applied to respective plating regions of the substrate 500.

A virtual plane on which a plurality of clamps is disposed may be parallel to the surface of the plating solution 700.

For example, the surface of the substrate 500 may be maintained parallel to the surface of the plating solution 700 by the plurality of clamps 101 that fixes the substrate 500.

Herein, it has been described that the clamp 101 functions to grasp the substrate 500 and apply a current to the substrate 500. However, the present disclosure is not limited thereto. The clamp 101 may be configured separately from a cathode.

The anode 210 may have a rectangular parallelepiped shape. For example, the anode 210 may have a rectangular shape whose width along the X-axis direction as the movement direction of the anode 210 is smaller than a length along a Y-axis direction perpendicular to the X-axis direction. Further, the anode 210 may have a rectangular shape whose width along the X-axis direction as the movement direction of the anode 210 is smaller than a height along a Z-axis direction perpendicular to the X-axis and Y-axis directions. For example, the anode 210 may have a rectangular shape whose X-axis directional width is smaller than the Y-axis directional length and the Z-axis directional height, but is not limited thereto.

The spray nozzle 230 sprays the plating solution 700 downwards toward the substrate 500. The spray nozzle 230 may be disposed adjacent to the anode 210. The spray nozzle 230 may be combined with the anode 210 and moved with the anode 210 in the X-axis direction. The spray nozzle 230 supplies the plating solution 700 from above the substrate 500. Thus, the spray nozzle 230 can support the circulation of the plating solution 700 within the plating bath 150 and maintain a constant concentration of the plating solution 700.

The spray nozzle 230 may include a plurality of spray nozzles disposed in the Y-axis direction along the surface of the substrate 500. Since the plurality of spray nozzles 230 is used, the plating solution 700 can be rapidly supplied when electro-forming is performed. Further, the spray nozzle 230 may be disposed on only one surface or on both surfaces of the substrate 500 based on the X-axis direction that is the movement direction of the anode 210. Furthermore, the spray nozzle 230 may be rotatable with adjustable spraying direction and angle.

The insulator 220 may be disposed between the anode 210 and the spray nozzle 230. As described above, when the spray nozzle 230 is disposed on the both surfaces based on the X-axis direction of the anode 210, the insulator 220 may also be disposed on both sides, e.g., inside the spray nozzle 230 and outside the anode 210. The insulator 220 may enable the smooth flow of the plating solution 700 sprayed from the spray nozzle 230 toward the substrate 500. For example, an end (or end surface) of the anode 210 and an end surface of the spray nozzle 230 may be the same height. A space between the anode 210 and the spray nozzle 230 may be filled with the insulator to form one plane from the end (end surface) of the anode 210 to the end surface) of the spray nozzle 230. In this case, the flow of the plating solution 700 can be maintained uniform in a region of the anode 210 reacting with the substrate 500. In some embodiments, the end or end surface of the anode 210 or the spray nozzle 230 may have a shape of a tip. However, the end of the anode 210 or the end of the spray nozzle 230 is not limited to only these shapes and may have other shapes as well. Details thereof will be described later with reference to FIG. 7A and FIG. 7B.

The assembly 200 is a combination of the anode 210, the insulator 220, and the spray nozzle 230. The configuration of the assembly 200 may enable the optimization of the spraying of the plating solution 700 and the applying of a current of the anode 210 to form a plating layer on the substrate 500.

The connection unit 310 is disposed on the plating bath 150 and connected to the assembly 200 including the anode 210 and the spray nozzle 230. The connection unit 310 can fix the assembly 200 and adjust the Z-axis directional height of the assembly 200. The connection unit 310 may adjust the height of the assembly 200 relative to the substrate 500 during an electro-forming process to regulate and optimize a flow rate of the plating solution 700 and currents for respective regions of the substrate 500.

The driving unit 320 is combined with the connection unit 310 to reciprocate the connection unit 310 in the X-axis direction that is the movement direction of the anode 210. The driving unit 320 may be disposed above the side of the plating bath 150. For example, the driving unit 320 may be disposed above an input portion where the substrate 500 is loaded into the plating bath 150 and an output portion where the substrate 500 is unloaded from the plating bath 150, respectively. The connection units 310 may be disposed on respective both sides of the plating bath 150 to reciprocate the assembly 200 in the X-axis direction without floating. The driving unit 320 may control the movement speed of the anode 210 and the spray nozzle 230 to regulate the thickness and area of a plating layer to be formed on the substrate 500. In one or more embodiments, the driving unit 320 may also be referred to as a driving structure 320 that may be operated by electrical power or motor for providing movement to the assembly 200 connected to the connection unit 310. Any suitable machinery for properly assisting the movement of the assembly 200 during the electroplating process may be employed. FIG. 1 illustrates that the driving unit 320 disposed above the output portion of the substrate 500 is cut/removed and FIG. 2 and FIG. 3 do not illustrate the driving unit 320 for better understanding of the present disclosure.

The plating solution 700 may fill in the plating bath 150. The plating solution 700 may contain various ions to be used for an electro-forming process. A mask which is a product manufactured by the electro-forming apparatus 100 according to an embodiment of the present disclosure may be used to deposit an organic layer in a heated environment instead of at room temperature. Therefore, the mask may be formed of, e.g., Invar or the like. As such, if the electro-forming apparatus uses Invar for plating, the plating solution 700 may be a mixture solution. The mixture solution may be composed of anhydrous nickel sulfate ($NiSO_4$), nickel ions using nickel chloride ($NiCl_2$) or the like, an iron ion source using anhydrous iron sulfate ($FeSO_4$) or the like, a pH regulator such as boric acid, polish, a stress reliever, and a stabilizer. However, the present disclosure is not limited thereto. Herein, it is assumed that the plating layer is formed of Invar, but a material of the plating layer is not limited thereto.

The plating solution storage 490 is a storage configured to store the plating solution 700 within the electro-forming apparatus 100. The plating solution 700 in the plating solution storage 490 is sprayed toward the substrate 500 through the second plating solution transfer line 470, the plating solution transfer unit 400, the first plating solution transfer line 410, and the spray nozzle 230. The plating solution 700 starting from the plating solution storage 490 is supplied as branched in the plating solution transfer unit 400 into the plurality of spray nozzles 230 disposed in the Y-axis direction on the side of the anode 210. A pair of first plating solution transfer lines 410a and 410b may be disposed corresponding to the spray nozzles 230 disposed on both surfaces of the anode 210. However, the present disclosure is not limited thereto.

The power supply unit 900 is electrically connected to the clamp 101 and the anode 210 and supplies a current. For example, the power supply unit 900 may apply a voltage to the clamp 101 and the anode 210 to allow a constant current to flow between the clamp 101 and the anode 210. Since the constant current flows between the clamp 101 and the anode 210, a plating layer uniform in thickness and surface profile may be formed.

The power supply unit 900 may apply a constant voltage such as a direct current (DC) voltage to the anode 210 and apply an alternating current (AC) voltage to the clamp 101. Herein, the AC voltage may have various waveforms such as a sine wave, a pulse wave, or a triangle wave. In this case, the power supply unit 900 may apply a voltage of the same phase to the first clamp 101a and the second clamp 101b disposed facing each other among the plurality of clamps 101. In this case, as the anode 210 moves, a current flowing between the first clamp 101a and the anode 210 and a current flowing between the second clamp 101b and the anode 210 may be changed. However, the sum of the current flowing between the anode 210 and the first clamp 101a as well as the current flowing between the anode 210 and the second clamp 101b disposed facing the first clamp 101a may be constant.

The controller 800 is connected to the power supply unit 900 and controls currents applied from the power supply unit 900 to the clamp 101 and the anode 210. For example, the controller 800 may regulate current densities generated by the clamp 101 and the anode 210 to control the thickness and surface profile of a plating layer. In one or more embodiments, the controller 800 includes a processing circuitry such as a microprocessor, microcontroller, integrated circuit, chip, microchip or the like suitable for performing and executing the algorithms, steps of the controller 800 described herein.

For example, the controller 800 may regulate a current density to be applied to the clamp 101 depending on a position of the anode 210 moving between the first clamp 101a and the second clamp 101b disposed facing each other. The controller 800 may sense a position of the anode 210. Then, the controller 800 may regulate a voltage to be applied to the plurality of clamps 101 or turn on/off the clamps 101 based on the area of plating on the substrate 500 corresponding to the position of the anode 210. Otherwise, voltages to be applied to the plurality of clamps 101 according to a change in position of the anode 210 may be stored in a memory of the controller 800. When the position of the anode 210 is changed, the controller 800 may regulate a voltage to be applied to the plurality of clamps 101 or turn on/off the clamps 101 based on the data stored in the memory. Thus, the controller 800 may regulate the amount of current to be applied to each plating region to regulate the amount and thickness of a plating layer to be formed on the plating region.

In the electro-forming apparatus 100 according to an embodiment of the present disclosure, a constant current may flow between the clamp 101 and the anode 210, and, thus, a plating layer uniform in thickness and surface profile may be formed. A DC voltage may be applied to the anode 210 and an AC voltage may be applied to the clamp 101. In this case, to maintain a constant current between the anode 210 the clamp 101, the controller 800 may regulate the intensity of a voltage applied to the first clamp 101a and the second clamp 101b facing each other. Thus, the sum of currents applied to the first clamp 101a and the second clamp 101b can be maintained constant.

Figure 4:
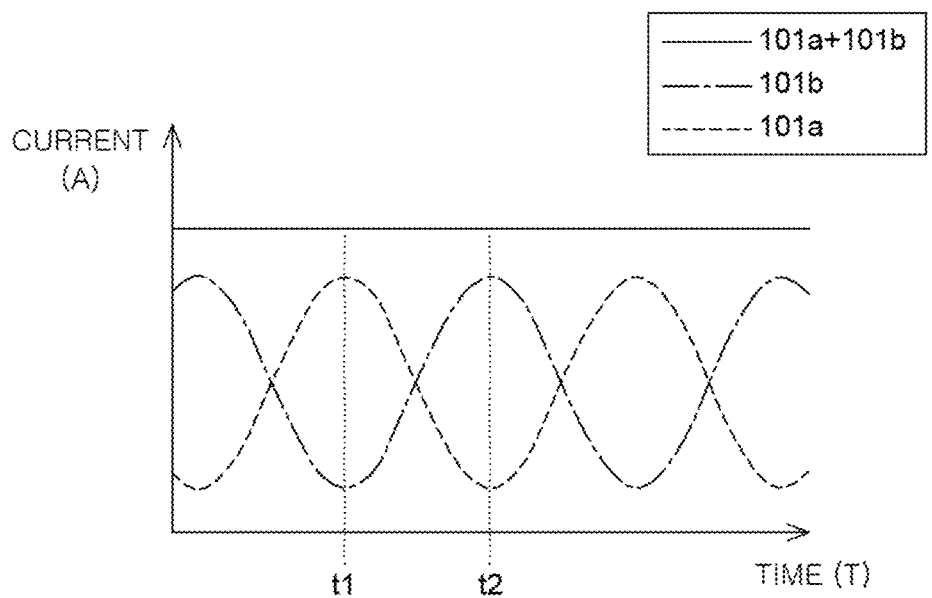
FIG. 4 is an exemplary graph provided to explain a current applied to a cathode of the apparatus for electro-forming according to an embodiment of the present disclosure.

FIG. 4 is an exemplary graph provided to explain a current applied to a cathode of the apparatus for electro-forming according to an embodiment of the present disclosure. For example, FIG. 4 illustrates currents applied through the first clamp 101a and the second clamp 101b facing each other.

Referring to FIG. 4, an AC voltage is applied to the first clamp 101a and the second clamp 101b. In this case, if the same voltage is applied to the first clamp 101a and the second clamp 101b, a current flowing between the first clamp 101a and the anode 210 and a current flowing between the second clamp 101b and the anode 210 may be changed as the anode 210 moves. However, since the same voltage is applied to the first clamp 101a and the second clamp 101b, the sum of the current flowing between the first clamp 101a and the anode 210 and the current flowing between the second clamp 101b and the anode 210 can be maintained constant.

More specifically, the same voltage may be applied to the first clamp 101a and the second clamp 101b. In this case, when the anode 210 is located closest to the first clamp 101a and farthest from the second clamp 101b (t1), a resistance between the first clamp 101a and the anode 210 is minimum. Thus, a current flowing between the first clamp 101a and the anode 210 is maximum. On the other hand, the anode 210 is located farthest from the second clamp 101b, and, thus, a resistance between the second clamp 101b and the anode 210 is maximum and a current flowing between the second clamp 101b and the anode 210 is minimum.

Then, as the anode 210 moves from the side of the first clamp 101a toward the side of the second clamp 101b, the resistance between the first clamp 101a and the anode 210 may gradually increase. Thus, the current flowing between the first clamp 101a and the anode 210 may gradually decrease.

Then, when the anode 210 is located closest to the second clamp 101b and farthest from the first clamp 101a (t2), the resistance between the second clamp 101b and the anode 210 is minimum. Thus, the current flowing between the second clamp 101b and the anode 210 is maximum. On the other hand, the anode 210 is located farthest from the first clamp 101a, the resistance between the first clamp 101a and the anode 210 is maximum and the current flowing between the first clamp 101a and the anode 210 is minimum.

Conventionally, the vertical electro-forming method has been used. According to the vertical electro-forming method, a connection between a cathode and a seed pattern of a substrate is made on only one side of the substrate. Therefore, a contact between the cathode and the seed pattern is made at a single point. Thus, a resistance of the seed pattern increases as being away from a contact portion between the cathode and the seed pattern. Therefore, according to the vertical electro-forming method, it is very difficult to form a uniform plating layer on the entire substrate. Further, according to the vertical electro-forming method, the substrate is disposed in a vertical direction. Thus, a gas such as hydrogen and a by-product such as salt generated during the plating process may be accumulated in the vertical direction. That is, obstacles to plating may be accumulated. Furthermore, according to the vertical electro-forming method, the substrate being transferred in a horizontal direction needs to be rotated to the vertical direction in order to load the substrate into a plating bath. After the plated substrate is unloaded from the plating bath, the substrate needs to be rotated again to the horizontal direction. Therefore, the plating bath and its peripheral devices become bulky.

The electro-forming apparatus 100 according to an embodiment of the present disclosure performs a plating process by a horizontal electro-forming method to solve the above-described problems of the vertical electro-forming method. For example, the plurality of clamps 101 of the electro-forming apparatus 100 according to an embodiment of the present disclosure may be disposed on both sides of the substrate 500. For example, the first clamp 101*a*, the third clamp 102*a*, the fifth clamp 103*a*, the seventh clamp 104*a*, and the ninth clamp 105*a* may be disposed on one side of the substrate 500. Further, the second clamp 101*b*, the fourth clamp 102*b*, the sixth clamp 103*b*, the eighth clamp 104*b*, and the tenth clamp 105*b* may be disposed on the other side of the substrate 500. Thus, the plurality of clamps 101 may be electrically connected to the seed pattern on the substrate 500. Therefore, a resistance of the seed pattern can be maintained constant due to multi-contacts between the clamps 101 and the seed pattern. Thus, in the electro-forming apparatus 100 according to an embodiment of the present disclosure, the current density can be maintained uniform throughout the substrate 500 and a uniform plating layer can be formed.

Further, the electro-forming apparatus 100 according to an embodiment of the present disclosure performs a plating process by the horizontal electro-forming method to reduce or minimize the accumulation of obstacles to plating. For example, in the electro-forming apparatus 100 according to an embodiment of the present disclosure, the substrate 500 is disposed in the horizontal direction. Thus, the surface of the substrate 500 may be disposed substantially parallel to the surface of the plating solution 700. Therefore, it is possible to reduce or minimize the accumulation of a gas or by-product generated during the plating process.

Furthermore, the electro-forming apparatus 100 according to an embodiment of the present disclosure performs a plating process by the horizontal electro-forming method to reduce or minimize the volume of the system. If in-line processes are used in a manufacturing process, a manufacturing target, e.g., a substrate, is moved in the horizontal direction during the manufacturing process. Thus, if the electro-forming apparatus 100 performs a plating process by the horizontal electro-forming method, the substrate being disposed in the horizontal direction can be loaded into the plating bath. After the plated substrate is unloaded from the plating bath, the substrate can be moved as it is to a cleaning device. Thus, in the electro-forming apparatus 100 according to an embodiment of the present disclosure, any device for rotating the substrate 500 from the horizontal direction to the vertical direction or from the vertical direction to the horizontal direction is not required. Therefore, the volume of the system can be reduced. According to the vertical electro-forming method, the plating bath needs to have a size more than double the lengthwise dimension of the substrate. However, according to the horizontal electro-forming method as in the electro-forming apparatus 100 according to an embodiment of the present disclosure, the plating bath 150 may have a size much smaller than the double of the size of the substrate 500. Thus, in the electro-forming apparatus 100 according to an embodiment of the present disclosure, the size of the plating bath 150 can be reduced to decrease or minimize the volume of the system.

In the electro-forming apparatus 100 according to an embodiment of the present disclosure, the cathode is composed of the plurality of clamps 101, and, thus, different currents for respective plating regions can be achieved. For example, the cathode may include the first clamp 101*a*, the third clamp 102*a*, the fifth clamp 103*a*, the seventh clamp 104*a*, and the ninth clamp 105*a* disposed on one side of the substrate 500. Further, the cathode may include the second clamp 101*b*, the fourth clamp 102*b*, the sixth clamp 103*b*, the eighth clamp 104*b*, and the tenth clamp 105*b* disposed on the other side of the substrate 500. Voltages applied to the first clamp 101*a*, the third clamp 102*a*, the fifth clamp 103*a*, the seventh clamp 104*a*, and the ninth clamp 105*a* and the second clamp 101*b*, the fourth clamp 102*b*, the sixth clamp 103*b*, the eighth clamp 104*b*, and the tenth clamp 105*b* respectively facing each other may be controlled. Thus, the cathode may implement different currents for respective plating regions. For example, in order to implement a higher current in a plating region corresponding to the leftmost first clamp 101*a* and second clamp 101*b* among the first clamp 101*a*, the third clamp 102*a*, the fifth clamp 103*a*, the seventh clamp 104*a*, and the ninth clamp 105*a* and the second clamp 101*b*, the fourth clamp 102*b*, the sixth clamp 103*b*, the eighth clamp 104*b*, and the tenth clamp 105*b* than in a plating region corresponding to the third clamp 102*a* and the fourth clamp 102*b* located next to the leftmost ones, a voltage applied to the leftmost first clamp 101*a* and second clamp 101*b* may be set to be higher than a voltage applied to the third clamp 102*a* and the fourth clamp 102*b* located next to the leftmost ones. As such, when a voltage applied to the first and second clamps 101*a* and 101*b* is set to be different from a voltage applied to the third and fourth clamps 102*a* and 102*b*, a current in the plating region corresponding to the first and second clamps 101*a* and 101*b* can be different from a current in the plating region corresponding to the third and fourth clamps 102*a* and 102*b*. Thus, as shown in FIG. 3, if five pairs of clamps are disposed, it is possible to implement different currents for five plating regions, respectively.

If a first single cathode is disposed on one side of the substrate and a second single cathode is disposed on the opposite side of the substrate, a single voltage is applied from the cathode to all of plating regions. Therefore, different currents for respective plating regions cannot be achieved. That is, if a single cathode is disposed on each of the both sides of the substrate, the same current is implemented for the entire region of the substrate 500. However, with multiple pairs of cathodes from opposite ends of the substrate 500 (or the plating bath 150), as mentioned above, implementing different current for each respective plating regions is possible.

However, in the electro-forming apparatus 100 according to an embodiment of the present disclosure, since the cathode include the plurality of cathodes 101, different currents for respective plating regions can be achieved compared to the case where a single cathode is disposed on each of the both sides of the substrate.

As described above, in the electro-forming apparatus 100 according to an embodiment of the present disclosure, different current for respective plating regions can be achieved using the first clamp 101*a*, the third clamp 102*a*, the fifth clamp 103*a*, the seventh clamp 104*a*, and the ninth clamp 105*a* and the second clamp 101*b*, the fourth clamp 102b, the sixth clamp 103b, the eighth clamp 104b, and the tenth clamp 105b. Therefore, in the electro-forming apparatus 100 according to an embodiment of the present disclosure, a plating layer with a uniform thickness can be formed on the substrate 500.

For example, the area of plating in a plating region corresponding to the leftmost first clamp 101a and second clamp 101b may be larger than the area of plating in a plating region corresponding to the third clamp 102a and the fourth clamp 102b. For example, assuming that a plating layer with a plating area of about 1 $cm^2$ may be formed in the plating region corresponding to the first clamp 101a and the second clamp 101b and a plating layer with a plating area of about 1 $mm^2$ may be formed in the plating region corresponding to the third clamp 102a and the fourth clamp 102b, a seed pattern disposed on the substrate 500 in the plating region corresponding to the first clamp 101a and the second clamp 101b may be greater in size than a seed pattern disposed on the substrate 500 in the plating region corresponding to the third clamp 102a and the fourth clamp 102b. However, if a current in the plating region corresponding to the first clamp 101a and the second clamp 101b may be the same as a current in the plating region corresponding to the third clamp 102a and the fourth clamp 102b, a current density of the seed pattern in the plating region corresponding to the third clamp 102a and the fourth clamp 102b may be greater than a current density of the seed pattern in the plating region corresponding to the first clamp 101a and the second clamp 101b. In this case, a plating layer formed in the plating region corresponding to the leftmost first clamp 101a and second clamp 101b may have a smaller thickness than a plating layer formed on the plating region corresponding to the third clamp 102a and the fourth clamp 102b due to a difference in current density. Therefore, a plating layer with different thicknesses for the respective plating regions may be formed. Thus, the plating layer may not have a uniform thickness.

However, in the electro-forming apparatus 100 according to an embodiment of the present disclosure, different currents for respective plating regions can be achieved in consideration of the area of plating in each plating region. For example, the area of plating in a plating region corresponding to the leftmost first clamp 101a and second clamp 101b may be greater than the area of plating in a plating region corresponding to the third clamp 102a and the fourth clamp 102b. In this case, a higher current may be applied to the plating region corresponding to the leftmost first clamp 101a and second clamp 101b than to the plating region corresponding to the third clamp 102a and the fourth clamp 102b. Thus, a current density can be uniform in the plating region corresponding to the first clamp 101a and the second clamp 101b and the plating region corresponding to the third clamp 102a and the fourth clamp 102b. Therefore, in the electro-forming apparatus 100 according to an embodiment of the present disclosure, the overall thickness of a plating layer can be uniform, and a difference in thickness of the plating layer caused by a difference in the area of plating can be reduced or minimized. Therefore, a plating layer uniform in thickness and surface profile can be formed.

Further, in the electro-forming apparatus 100 according to an embodiment of the present disclosure, the level of a voltage applied to a pair of clamps may be controlled. Thus, a difference in thickness of a plating layer in a plating region corresponding to the pair of clamps can be reduced or minimized. For example, in the plating region corresponding to the leftmost first clamp 101a and second clamp 101b, as the anode moves, the area of plating may be changed. For example, the area of plating in the plating region corresponding to the first clamp 101a and the second clamp 101b may be about 1 $cm^2$ at a first time point, and the area of plating in the plating region corresponding to the first clamp 101a and the second clamp 101b may be about 1 $mm^2$ at a second time point after the first time point. However, if the first clamp 101a and the second clamp 101b are applied with the same voltage at the first time point and the second time point, a plating layer with a smaller thickness may be formed at the first time point and a plating layer with a greater thickness may be formed at the second time point. Thus, a voltage applied to the first clamp 101a and the second clamp 101b at the second time point may be smaller than a voltage applied to the first clamp 101a and the second clamp 101b at the first time point in order to implement a uniform current density even when the anode moves. Thus, in the electro-forming apparatus 100 according to an embodiment of the present disclosure, the overall thickness of a plating layer can be uniform, and a difference in thickness of the plating layer caused by a difference in the area of plating can be reduced or minimized. Therefore, a plating layer uniform in thickness and surface profile can be formed.

Figure 5A:
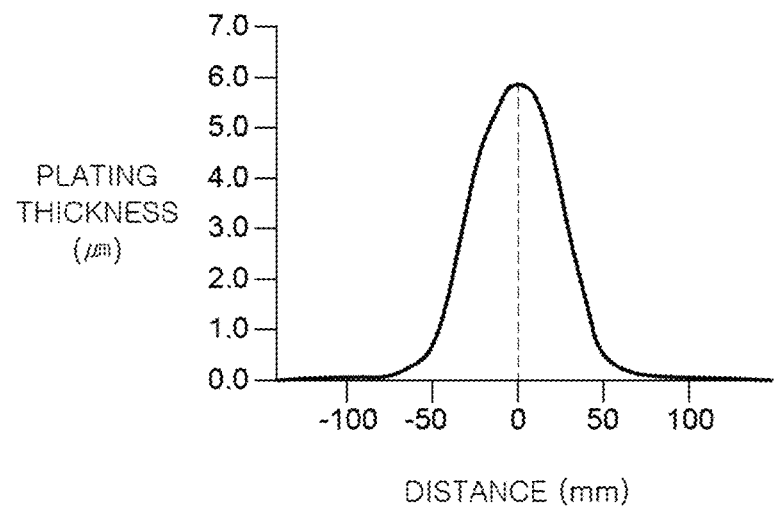
FIG. 5A through FIG. 5C are graphs showing the thickness of a plating layer formed by the apparatus for electro-forming according to an embodiment of the present disclosure, the composition ratio of the plating layer, and the current density in a Z-axis direction, respectively.
Figure 5B:
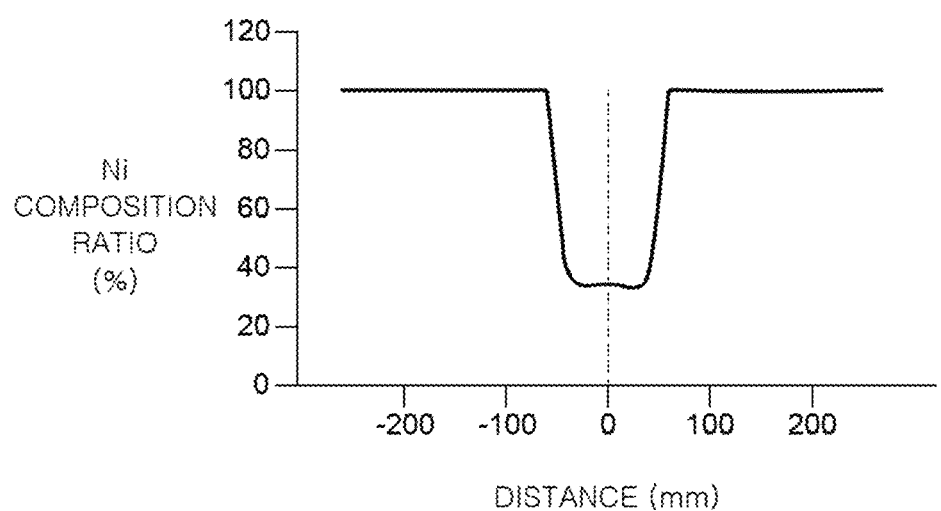
Figure 5C:
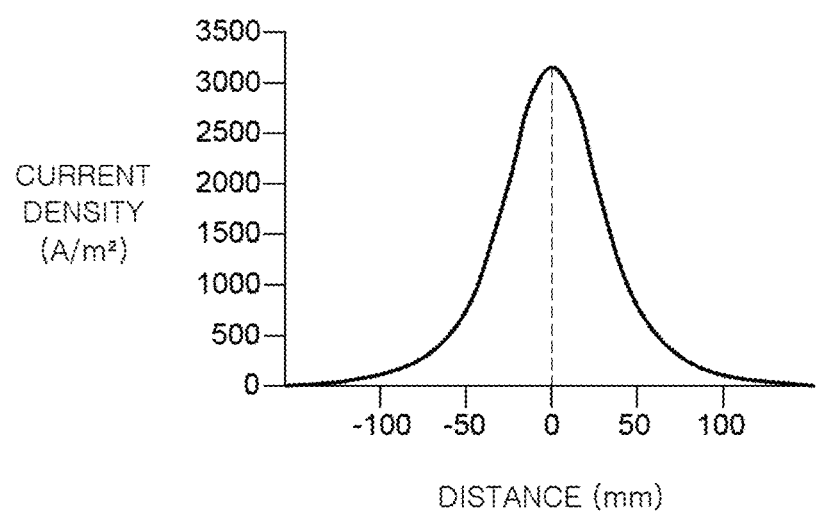

FIG. 5A through FIG. 5C are graphs showing the thickness of a plating layer formed by the apparatus for electro-forming according to an embodiment of the present disclosure, the composition ratio of the plating layer, and the current density in the Z-axis direction, respectively.

In an embodiment of the present disclosure, the X-axis directional width of the anode is about 40 mm. A plating process was performed using the electro-forming apparatus according to an embodiment of the present disclosure while the distance between the substrate and the anode was maintained at about 30 mm.

FIG. 5A shows the measurement result of the X-axis directional thickness of the plating layer based on the center of the anode when plating was performed using the electro-forming apparatus according to an embodiment of the present disclosure. Referring to FIG. 5A, it can be seen that the thickness of the plating layer sharply decreases as being away from the center of the anode. The plating layer formed by electro-forming apparatus according to an embodiment of the present disclosure may have a thickness distribution similar to the Gaussian distribution.

FIG. 5B shows the measurement result of the composition ratio of nickel in the plating layer along the X-axis direction based on the center of the anode when plating was performed using the electro-forming apparatus according to an embodiment of the present disclosure. Referring to FIG. 5B, it can be seen that the content of nickel is maintained constant at about 37% in the range of about +/−50 mm from the center of the anode. Referring to the result shown in FIG. 5B, it can be seen that if the electro-forming apparatus according to an embodiment of the present disclosure is used and the anode is located nearby, plating is performed to result in a uniform composition ratio of nickel.

FIG. 5C shows the simulation of a current density generated when the anode is fixed based on the measurement results of FIG. 5A and FIG. 5B in the electro-forming apparatus according to an embodiment of the present disclosure. Referring to FIG. 5C, as for a single anode with a width of 40 mm, a current density distribution in the Z-axis direction is similar to the Gaussian distribution. For example, the current density sharply increases as being closer to the center of the anode. The electro-forming apparatus according to an embodiment of the present disclosure shows a high current density around the anode. Thus, it can be seen that the movement of the anode and the plating solution for each plating region in the substrate is very important to obtain a plating layer uniform in thickness, surface profile and composition ratio of nickel.

For example, a mask for deposition of an organic layer may be manufactured using an electro-forming apparatus and the mask may be formed of Invar. In this case, it is very important to realize a uniform composition ratio of nickel forming Invar in the range of from about 36% to about 40%. The mask for deposition of an organic layer is used in a heated environment instead of at room temperature. Further, the organic layer needs to be deposited accurately at a desired position using the mask, and, thus, a pattern shape of the mask needs to be very precisely formed. If the size or shape of the pattern changes as the temperature changes, it is impossible to deposit the organic layer at a desired portion. Thus, if a mask is formed of Invar by electro-forming, the composition ratio of nickel in the mask needs to be maintained uniform in the range of from about 36% to about 40% to reduce or minimize a change in size of the mask as the temperature changes.

Figure 6A:
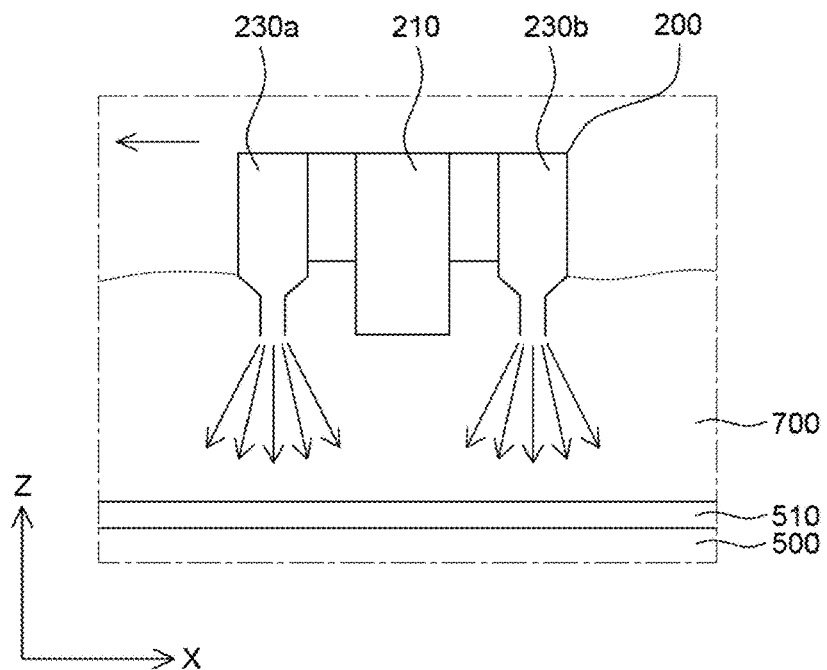
FIG. 6A and FIG. 6B show a cross-section of an assembly including an anode and a plating solution supply unit of the apparatus for electro-forming according to an embodiment of the present disclosure.
Figure 6B:
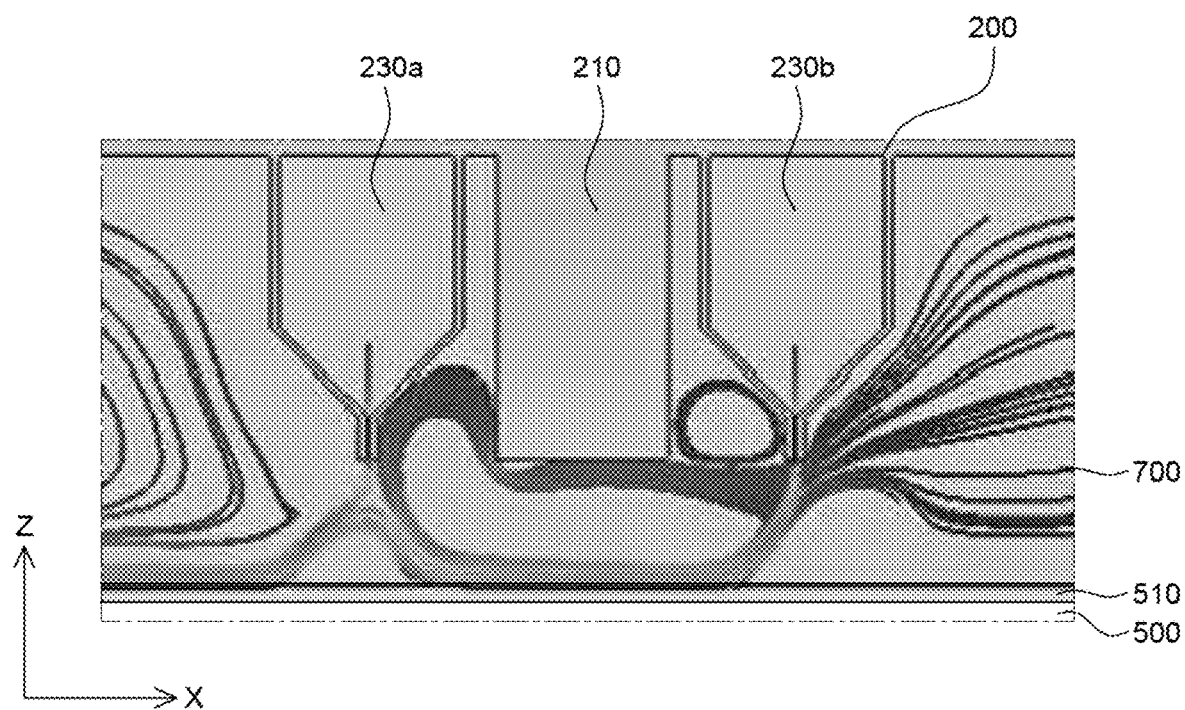

FIGS. 6A and 6B show a cross-section of an assembly including an anode and a plating solution supply unit of the apparatus for electro-forming according to an embodiment of the present disclosure. For example, FIG. 6A and FIG. 6B show a cross-section of the assembly 200 of the electro-forming apparatus and the simulation result on the flow velocity according to an experimental example of the present disclosure. FIG. 6A shows the cross-section of the assembly 200 and the plating solution 700 being sprayed according to the experimental example of the present disclosure. The inventors of the present disclosure found that an ion concentration in a plating region as well as the current density and composition ratio of nickel is one of the factors affecting the thickness of a plating layer 510. Also, the inventors of the present disclosure found that a change in ion concentration can be checked by checking the flow velocity of the plating solution 700. In the present experimental example, the assembly 200 includes the anode 210 and a plating solution supply unit which includes a first spray nozzle 230a and a second spray nozzle 230b which are disposed on respective both sides of the anode 210 in the X-axis direction. The assembly 200 is set to spray the plating solution 700 on the substrate 500 to check the flow velocity. Unlike an embodiment of the present disclosure, the insulator 220 is not disposed between the anode 210 and the first spray nozzle 230a and between the anode 210 and the second spray nozzle 230b in the present experimental example. This is to find out differences between an embodiment of the present disclosure and the present experiment. The assembly 200 was located about 30 mm above the substrate 500 and the plating solution 700 was sprayed from the spray nozzle 230 at about 50 lpm. Further, the anode 210 was moved at a speed of about 370 mm/min to the left in FIG. 6A. In the experimental example, the insulator 220 is not disposed in the assembly 200, and, thus, the assembly 200 can be manufactured into a simple and light structure. Further, the plating solution 700 can be supplied thick between the anode 210 and the substrate 500.

Referring to FIG. 6B, it can be seen that under the conditions of the present experimental example, when the assembly 200 sprays the plating solution 700 while moving, the existing solution in the plating bath 150 and a new solution supplied from the spray nozzle 230 flow to the right along their trajectories. It can be seen that a large amount of fluid flows and stays between the anode 210 and the first spray nozzle 230a and between the anode 210 and the second spray nozzle 230b. Further, it can be seen that a layer of the plating solution 700 is formed thick around the anode 210 and flows along the upper surface of the substrate 500. The inventors of the present disclosure recognized that the remaining plating solution in the plating bath 150 and the new solution supplied from the spray nozzle 230 meet and generate a swirl in a space beside the anode 210 based on the flow velocity of the experimental example. Further, the inventors of the present disclosure recognized that the swirl generated beside the anode 210 causes the new solution, which should flow to plating regions of the substrate 500, to stay in the swirl around the anode 210. If the new solution is not sufficiently supplied to the plating regions of the substrate 500 from the spray nozzle 230, concentration gradients are generated in the respective plating regions. Thus, a plating layer 510 may have a non-uniform thickness.

FIGS. 7A and 7B show the distribution of a plating solution supplied from the assembly of the apparatus for electro-forming according to an embodiment of the present disclosure. For example, FIG. 7A and FIG. 7B show a cross-section of the assembly 200 of the electro-forming apparatus and the simulation result on the flow velocity according to an embodiment of the present disclosure. FIG. 7A shows the cross-section of the assembly 200 and the plating solution 700 being sprayed according to the embodiment of the present disclosure. The inventors of the present disclosure devised a method for removing a swirl of the plating solution 700 from plating regions of the substrate 500 based on the above-described experimental example shown in FIG. 6A and FIG. 6B. Referring to FIG. 7A, a first insulator 220a and a second insulator 220b were disposed in respective spaces between the first spray nozzle 230a and the second spray nozzle 230b disposed on the left and right sides of the anode 210 in the X-axis direction in the assembly 200. The end surfaces of the spray nozzles 230 and the end surface of the anode 210 are disposed collinearly, and respective end surfaces of the first insulator 220a and the second insulator 220b may also be disposed collinearly. Only the insulator 220 was further disposed in addition to the conditions of the experimental example. Specifically, the assembly 200 was located 30 mm above the substrate 500 and the plating solution 700 was sprayed from the spray nozzle 230 at about 50 lpm. Further, the anode 210 was moved at a speed of about 370 mm/min to the left in FIG. 7A.

Referring to FIG. 7B, it can be seen that under the conditions of the embodiment, when the assembly 200 sprays the plating solution 700 while moving, the existing solution in the plating bath 150 and a new solution supplied from the spray nozzle 230 flow to the right along their trajectories. A swirl of the plating solution 700 was not generated above the substrate 500 due to the insulator 220 disposed beside the anode 210, compared to the experimental example. Further, it was observed that the trajectories of the plating solution 700 meet above the plating regions of the substrate 500. Referring to FIG. 7B, it can be seen that when the assembly 200 performs plating while moving to the right or left in the X-axis direction, the new solution supplied from the spray nozzle 230 gently curves and is in contact with the upper surface of the substrate 500. If the new solution is sufficiently supplied to the upper surface of the substrate 500, the time to obtain a desired plating layer 510 can be reduced and the thickness of the plating layer 510 can become uniform.

Figure 8:
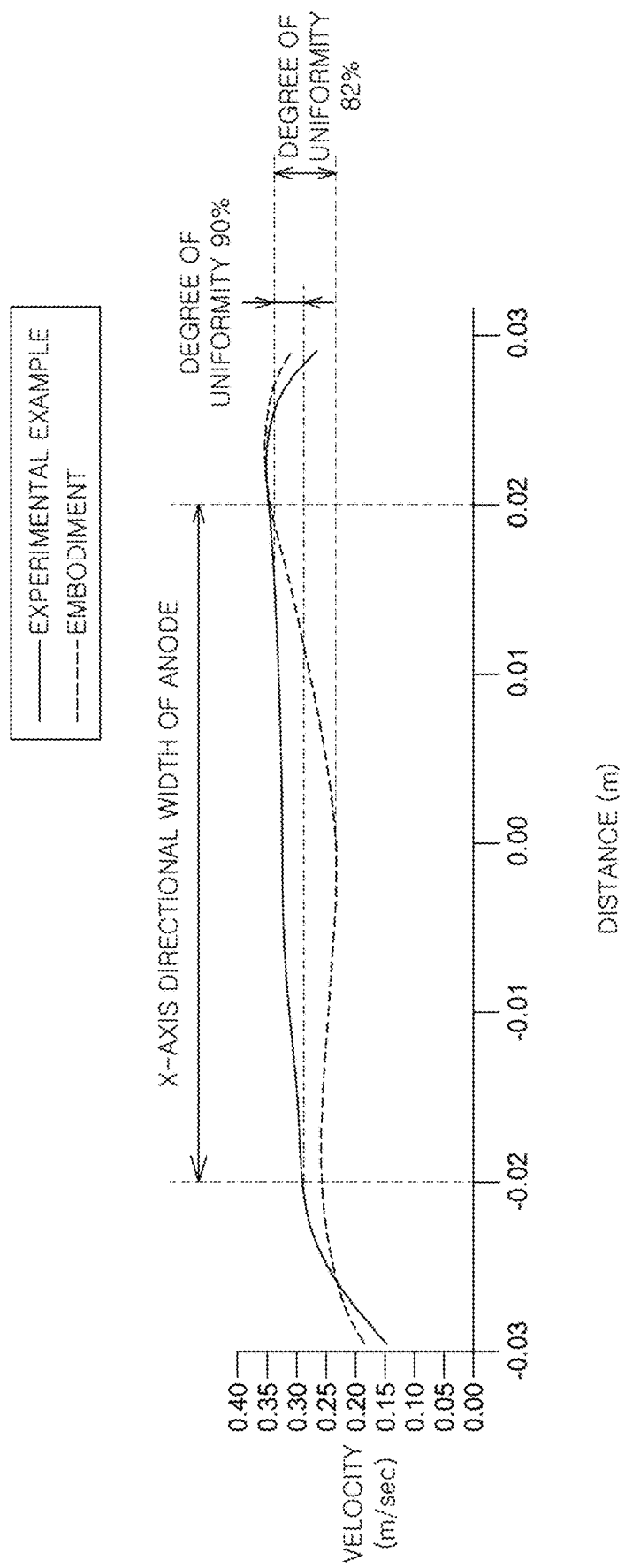
FIG. 8 is a graph showing the results of simulations on velocity profile of apparatuses for electro-forming according to an experimental example and an embodiment of the present disclosure.

FIG. 8 is a graph showing the results of simulations on velocity profile of apparatuses for electro-forming according to an experimental example and an embodiment of the present disclosure. The velocity profile shows the movement direction and movement velocity of a fluid at a corresponding position. In the graph shown in FIG. 8, a position corresponding to the center of the anode is set to 0 and a distance from the center of the anode is plotted on the X-axis and the velocity of a fluid flowing to the right is plotted on the Y-axis. Herein, the velocity of the fluid on the Y-axis is measured based on a point 800 μm above the substrate.

As described above, the experimental example is an electro-forming apparatus that does not include the insulator 220 but includes the anode 210 and the spray nozzle 230 disposed on both sides of the anode 210.

As described above, the embodiment of the present disclosure is an electro-forming apparatus that includes the insulator 220 and also includes the anode 210 and the spray nozzle 230 disposed on both sides of the anode 210 and the insulator 220. Herein, the end surface of the insulator 220, the end surface of the anode 210, and the end surface of the spray nozzle 230 are disposed collinearly, and, thus, a lower surface of the assembly 200 is flat without curves.

In both of the experimental example and the embodiment of the present disclosure, the X-axis directional width of the anode 210 was set to about 40 mm and the distance between the substrate 500 and the anode 210 was set to about 30 mm. Further, the anode 210 was formed of copper and the plating solution 700 contained water which is a fluid. The substrate 500 was formed of ITO on glass. Further, the plating solution 700 was sprayed from the spray nozzle 230 at about 50 lpm and the anode 210 was moved to the right at a speed of about 370 mm/min based on the graph of FIG. 8. The simulation was performed on the experimental example and the embodiment of the present disclosure using a simulation tool ANSYS FLUENT based on the above-described conditions.

Referring to FIG. 8, a region of the anode 210 is indicated by a dotted line. It can be seen that the flow velocity of a fluid is low in the left region where the anode 210 approaches and high in the right region where the anode 210 passes by. Further, it can be seen that the flow velocity is relatively slow in a lower region of the anode 210. It can be seen that in the experimental example without using the insulator 220, the flow velocity shows a large deviation in a plating region under the anode 210, compared to the embodiment of the present disclosure using the insulator 220. This is because of the swirl generated in the vicinity of the anode 210 as described above with reference to FIG. 6B. The swirl affects the plating region under the anode 210, which may result in a non-uniform composition ratio of plating and an increase in thickness distribution of the plating layer.

The inventors of the present disclosure calculated the degree of uniformity in the flow velocity in the plating region under the anode 210 to numerically check the flow velocity of a fluid. The degree of uniformity can be obtained according to the uniformity formula represented by 1−(MAX−MIN)/(MAX+MIN) and then converted into a percentage. Referring to FIG. 8, it can be seen that in the experimental example without using the insulator 220, the degree of uniformity in the flow velocity in the plating region under the anode 210 is about 82%. Further, it can be seen that in the embodiment of the present disclosure using the insulator 220, the degree of uniformity in the flow velocity in the plating region under the anode 210 is about 90%. Referring to FIG. 8, in the embodiment of the present disclosure, the flow velocity in the plating region under the anode 210 changes with a gentle slope. This may mean that the remaining solution in the plating bath 150 and the new solution sprayed from the spray nozzle 230 are uniformly diffused on the substrate 500. When the flow velocity of a fluid is constant, the plating solution 700 is in contact with the largest area of the substrate 500 for the longest time. Thus, a plating layer with a uniform thickness can be obtained.

Figure 9:
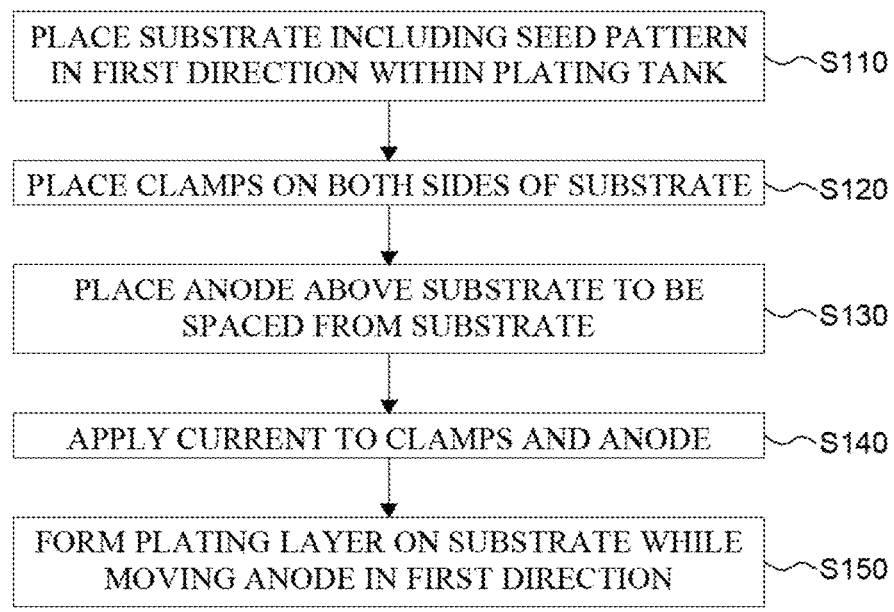
FIG. 9 is a schematic flowchart provided to explain a method for electro-forming according to an embodiment of the present disclosure.

FIG. 9 is a flowchart provided to explain a method for electro-forming according to an embodiment of the present disclosure. Referring to FIG. 9, the method for electro-forming according to an embodiment of the present disclosure includes placing a substrate including a seed pattern in a first direction within a plating bath (S110). Further, the method includes placing a plurality of cathodes on both sides of the substrate (S120) and placing an anode above the substrate to be spaced from the substrate (S130). A first cathode and a second cathode of the plurality of cathodes can form a pair in which the second cathode is opposite of the first cathode. In some embodiments, the second cathode is directly opposite of the first cathode. The method also includes applying a current to the plurality of cathodes and the anode (S140) and forming a plating layer on the substrate while moving the anode in the first direction (S150). In one embodiment, the first direction can be referred to as a horizontal direction and the anode may move along a direction parallel to the direction in which the first cathode and the second cathode are aligned within the plating bath. The method for electro-forming according to an embodiment of the present disclosure will be described based on the electro-forming apparatus 100 described above with reference to FIG. 1, FIG. 2, and FIG. 3, but is not limited thereto. The method for electro-forming according to an embodiment of the present disclosure can also be applied to another electro-forming apparatus.

First, the substrate 500 including the seed pattern is transferred and disposed in the first direction within the plating bath 150 (S110).

For example, the substrate 500, which is a plating target object, is disposed on the transfer support unit 110 located within the plating bath 150. The substrate 500 is disposed in the first direction within the plating bath 150. In this case, the substrate 500 may be disposed such that the surface of the substrate 500 is parallel to the surface of the plating solution 700 within the plating bath 150.

Then, a plurality of clamps 101 is disposed on both sides of the substrate 500 (S120). The plurality of clamps 101 holds onto the periphery of the substrate 500 and fixates its position within the plating bath 150.

The plurality of clamps 101 is disposed in contact with at least a part of the both sides of the substrate 500. In this case, the plurality of clamps 101 is connected to the seed pattern on the substrate 500 and applies a current thereto. For example, the plurality of clamps 101 may include the first clamp 101a, the third clamp 102a, the fifth clamp 103a, the seventh clamp 104a, the ninth clamp 105a, the second clamp 101b, the fourth clamp 102b, the sixth clamp 103b, the eighth clamp 104b, and the tenth clamp 105b, but is not limited thereto. In this case, the first clamp 101a, the third clamp 102a, the fifth clamp 103a, the seventh clamp 104a, and the ninth clamp 105a may be disposed on one side of the substrate 500 based on the first direction (e.g., X-axis direction) that is a movement direction of the anode 210. Further, the second clamp 101b, the fourth clamp 102b, the sixth clamp 103b, the eighth clamp 104b, and the tenth clamp 105b may be disposed on the other side of the substrate 500. In this case, the first clamp 101a, the third clamp 102a, the fifth clamp 103a, the seventh clamp 104a, and the ninth clamp 105a may be disposed collinearly facing the second clamp 101b, the fourth clamp 102b, the sixth clamp 103b, the eighth clamp 104b, and the tenth clamp 105b, respectively.

Then, the plating solution 700 is supplied into the plating bath 150. Thus, the plating bath 150 may be filled with the plating solution 700. When the plating solution 700 fills in the plating bath 150, the first clamp 101a, the third clamp 102a, the fifth clamp 103a, the seventh clamp 104a, and the ninth clamp 105a and the second clamp 101b, the fourth clamp 102b, the sixth clamp 103b, the eighth clamp 104b, and the tenth clamp 105b may be disposed parallel to the surface of the plating solution 700.

Then, the anode 210 is disposed above the substrate 500 at a distance from the substrate 500 (S130).

The anode 210 is disposed at a predetermined distance from the surface of the substrate 500. In the range where the anode 210 can maintain a constant current with the clamp 101 and have a uniform current density, the distance between the substrate 500 and the anode 210 can be regulated freely. For example, the distance between the substrate 500 and the anode 210 may be about 30 mm, but is not limited thereto.

The spray nozzle 230 may be provided as combined with the anode 210. In this case, like the anode 210, the spray nozzle 230 is also disposed at a distance from the surface of the substrate 500.

Then, a current is applied to the plurality of clamps 101 and the anode 210 (S140).

For example, a negative voltage is applied to the clamps 101 and a positive voltage is applied to the anode 210. Thus, a current may be formed between the plurality of clamps 101 and the anode 210.

The process of applying a current (S140) may include applying a constant current to the seed pattern through the plurality of clamps 101 and the anode 210. If a constant current flows between the clamps 101 and the anode 210, a plating layer uniform in thickness and surface profile can be formed.

In this case, the process of applying a constant current may include applying a constant voltage to the anode 210 and applying an AC voltage to the plurality of clamps 101.

In this case, the process of applying an AC voltage to the plurality of clamps 101 may include applying, to the plurality of clamps 101, an AC voltage which varies in level as the anode 210 moves. To maintain a constant current on the substrate 500 even if a position of the anode 210 is changed, the level of the AC current applied to the plurality of clamps 101 may be changed according to the change in position of the anode 210.

The process of applying an AC voltage to the plurality of clamps 101 may further include applying the same voltage to the first clamp 101a and the second clamp 101b disposed facing each other. Since the same AC voltage is applied to the first clamp 101a and the second clamp 101b disposed facing each other, the sum of currents applied to the first clamp 101a and the second clamp 101b is maintained constant when the anode 210 moves. Further, a constant current can be maintained between the anode 210 and the clamps 101.

The process of applying an AC voltage to the plurality of clamps 101 may further include applying a variable AC voltage to each of the plurality of clamps 101 based on the area of plating under the anode 210 at a position corresponding to each of the plurality of clamps 101. When the anode 210 moves, a voltage to be applied to the plurality of clamps 101 is regulated or the clamps 101 are turned on/off based on the area of plating in a plating region under the anode 210 corresponding to each of the plurality of clamps 101. A current density can be changed for each plating region, and, thus, the thickness and surface characteristics of a plating layer to be formed on the plating region can be regulated.

The process of applying a constant voltage to the anode 210 may further include independently applying a voltage to each of a plurality of sub-anodes 251 and 252.

Then, a plating layer is formed on the substrate 500 while the anode 210 is moved in the first direction (e.g., X-axis direction) (S150).

For example, the connection unit 310 and the driving unit 320 connected to the anode 210 may be used to move the anode 210 in the X-axis direction. The anode 210 is moved in the X-axis direction in a state where a current is applied to the plurality of clamps 101 and the anode 210. Thus, a plating layer is formed on the upper surface of the substrate 500 located under the anode 210.

A plating layer may be formed repeatedly by reciprocating the anode 210 in the X-axis direction.

If the spray nozzle 230 is combined with the anode 210, the spray nozzle 230 is moved in the X-axis direction together with the anode 210. The plating solution 700 is supplied from above the substrate 500 through the spray nozzle 230. Thus, it is possible to reduce or minimize a change in concentration of the plating solution 700 within the plating bath 150 and suppress a change in metal content in a plating layer.

The method for electro-forming according to an embodiment of the present disclosure relates to a horizontal electro-forming method by which the plurality of clamps 101 is disposed on the both sides of the substrate 500. Thus, a resistance of the seed pattern can be maintained constant due to multi-contacts between the clamps 101 and the seed pattern. Therefore, the current density can be maintained uniform throughout the substrate 500 and a uniform plating layer can be formed. Further, the method for electro-forming according to an embodiment of the present disclosure can suppress the vertical accumulation of by-products generated during the plating process by placing the surface of the plating solution 700 substantially parallel to the surface of the substrate 500.

Furthermore, this method can regulate currents applied to respective plating regions with the plurality of clamps 101 disposed on the both sides of the substrate 500 and thus change the current density. For example, this method can achieve different current densities for respective plating regions and thus regulate the thickness and surface characteristics of plating layers to be formed on the respective plating regions.

The exemplary embodiments of the present disclosure can also be described as follows:

According to an aspect of the present disclosure, there is provided an apparatus for electro-forming. The apparatus for electro-forming comprises a plating bath which is a space where a substrate is plated, a clamp disposed within the plating bath and configured to grasp the substrate disposed in a horizontal direction, an assembly including an anode spaced above the substrate and connected to an external power supply and a plating solution supply unit spaced above the substrate and configured to supply a plating solution, and a driving unit configured to reciprocate the assembly in a horizontal direction at a distance from the substrate. The assembly further includes an insulator between the anode and the plating solution supply unit.

The insulator may be spaced above the substrate, and an end surface of the insulator may be disposed parallel to an end surface of the anode.

An end surface of the plating solution supply unit may be disposed parallel to the end surface of the insulator.

The clamp may be employed as a cathode.

The clamp pairs up with another clamp and the pair of clamps may be disposed facing each other and grasp an end of the substrate.

The insulator may be made of a polymer.

The insulator may be made of an inorganic material.

An end surface of the insulator may be collinear with an end surface of the anode and an end surface of the plating solution supply unit.

The plating solution supply unit may be located at each of front and rear ends of the assembly in a movement direction of the assembly and disposed with the anode interposed therebetween.

According to another aspect of the present disclosure, there is provided an apparatus for horizontal electro-forming. The apparatus for horizontal electro-forming comprises a plating bath, a cathode unit disposed within the plating bath, an anode unit connected to an external power supply, a plating solution supply nozzle configured to supply a plating solution, and an assembly structure including the anode unit and the plating solution supply nozzle disposed on each of both side surfaces of the anode unit. The assembly structure further includes an insulator between the anode unit and the plating solution supply nozzle.

The cathode unit may include at least two cathodes and the cathodes are disposed on both sides within the plating bath.

The cathode unit may be disposed such that a pair of cathodes face each other.

A lower surface of the anode unit, a lower surface of the plating solution supply nozzle, and a lower surface of the insulator that constitute a lower surface of the assembly structure may be disposed collinearly.

The insulator may be made of an organic material.

The apparatus for horizontal electro-forming may further comprise a plating solution distributor above the plating solution supply nozzle.

The apparatus for horizontal electro-forming may further comprise a driving unit configured to reciprocate the assembly structure within the plating bath.

The apparatus for horizontal electro-forming may further comprise a transfer support unit disposed within the plating bath and configured to transfer and support a plating target object.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure.

The various embodiments described above can be combined to provide further embodiments. Additional changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus comprising:
    a plating bath configured to receive a substrate to be plated;
    a clamp disposed within the plating bath and configured to grasp the substrate disposed in a first direction;
    an assembly including:
        an anode spaced above the plating bath and electrically connected to an external power supply, the anode having a first end surface facing the plating bath;
        a plating solution supply spaced above the substrate and configured to supply a plating solution; and
        an insulator between the anode and the plating solution supply, the insulator being formed as a distinct structure separate from the anode and the plating solution supply, the insulator having a first end surface facing the plating bath; and
    a driving structure configured to reciprocate the assembly in the first direction at a distance from the substrate,
    wherein the first end surface of the anode and the first end surface of the insulator are coplanar with each other.

2. The apparatus according to claim 1, wherein the insulator
    has a second end spaced from the first end, opposite the plating bath and a width of the first end surface of the insulator is greater than a width of the second end surface of the insulator.

3. The apparatus according to claim 1, further including a spray nozzle coupled to the plating solution supply and configured to spray plating solution towards the substrate.

4. The apparatus according to claim 1, wherein the clamp to fix the substrate in the first direction operates as a cathode.

5. The apparatus according to claim 4, wherein the clamp pairs up with another clamp and a pair of clamps are disposed facing each other and grasp each end of the substrate.

6. The apparatus according to claim 5, further comprising a controller, wherein as the anode of the assembly moves, the controller controls a sum of a current flowing between the anode and the clamp as well as the current flowing between the anode and the another clamp to be constant.

7. The apparatus according to claim 5, further comprising a controller for regulating a current density to be applied to the clamp and the another clamp depending on a position of the anode moving between the clamp and the another clamp.

8. The apparatus according to claim 1, wherein the insulator is made of a polymer.

9. The apparatus according to claim 1, wherein the insulator is made of an inorganic material.

10. The apparatus according to claim 3, wherein the spray nozzle has an end surface facing the plating bath, the end surface of spray nozzle being coplanar with the first end surface of the insulator and the first end surface of the anode.

11. The apparatus according to claim 1, wherein the plating solution supply is located at each of front and rear ends of the assembly in a movement direction of the assembly and disposed with the anode interposed between the plating solution supply units located at front and rear ends of the assembly.

12. An apparatus comprising:
    a plating bath;
    an anode spaced above the plating bath and electrically connected to an external power supply, the anode having a first end surface facing the plating bath;

a plating solution supply source spaced above the substrate and configured to supply a plating solution to the plating bath;
a spray nozzle coupled to the plating solution supply and configured to spray plating solution into the plating bath, the spray nozzle having an end surface facing the plating bath; an insulator between the anode and the plating solution supply, the insulator being formed as a distinct structure separate from the anode and the plating solution supply, the insulator having a first end surface facing the plating bath;
wherein the end surface of the spray nozzle is in the same plane as the first end surface of the anode and the first end surface of the insulator.

13. The apparatus of claim 12 further including:
a clamp disposed within the plating bath and configured to grasp a substrate disposed in the plating bath.

\* \* \* \* \*